United States Patent [19]
Bentz et al.

[11] Patent Number: 5,170,325
[45] Date of Patent: Dec. 8, 1992

[54] SPRING ELEMENT FOR A GROUP OF COMPONENTS OF AN ELECTRONIC CONTROL DEVICE

[75] Inventors: Willy Bentz, Sachsenheim; Siegfried Goetzke, Bietigheim-Bissingen; Dieter Karr, Tiefenbronn; Jutta Schetter, Ludwigsburg; Peter Schiefer, Abstatt, all of Fed. Rep. of Germany

[73] Assignee: Robert Bosch GmbH, Stuttgart, Fed. Rep. of Germany

[21] Appl. No.: 767,795

[22] Filed: Sep. 27, 1991

[30] Foreign Application Priority Data

Oct. 10, 1990 [DE] Fed. Rep. of Germany ....... 9014091

[51] Int. Cl.⁵ .............................................. H05K 7/20
[52] U.S. Cl. ..................................... 361/388; 24/457; 165/80.3; 248/510
[58] Field of Search ............. 24/295, 457, 458, 473, 24/625; 411/516, 522, 523; 267/150; 248/316.7, 505, 510; 165/185, 80.3; 174/16.3; 357/81; 361/383, 386-389

[56] References Cited

U.S. PATENT DOCUMENTS

| | | | |
|---|---|---|---|
| 3,519,889 | 7/1970 | Monaco | 361/388 |
| 4,648,008 | 3/1987 | Neyroud | 361/387 |
| 4,872,089 | 10/1989 | Ocken | 361/388 |
| 4,899,255 | 2/1990 | Cafe | 361/386 |
| 4,964,198 | 10/1990 | McCarthy | 24/458 |
| 4,972,294 | 11/1990 | Moses, Jr. | 361/386 |
| 5,040,096 | 8/1991 | Churchill | 165/80.3 |

Primary Examiner—Gerald P. Tolin
Attorney, Agent, or Firm—Frishauf, Holtz, Goodman & Woodward

[57] ABSTRACT

A spring element, for securing components of an electronic control device, is essentially U-shaped, with a bridge portion (16), which rests on an end (11A) of a cooling fin (11) mounted perpendicularly on a printed circuit board (13), and a pair of depending spring legs (17, 18), one of which presses against a side face (11C) of the cooling fin (11) and the other of which presses a power component (14) against a major surface (11B) of the cooling fin (11). Preferably, the spring element (15, 15A) is formed with a pair of slots (23, 24) which facilitate engagement by a pair of tongs (25, 26) of an automatic mounting device. The tongs can spread open the spring element and position it around the cooling fin (11) and power component (14) without exerting any harmful shear forces on the fin or component. Preferably, each spring leg has a convex central section, below the slot, and a concave bottom or terminal end. Optionally, the inner surface of the terminal end (21A, 22A) is formed with a claw or tooth (27, 28) for better holding.

5 Claims, 1 Drawing Sheet

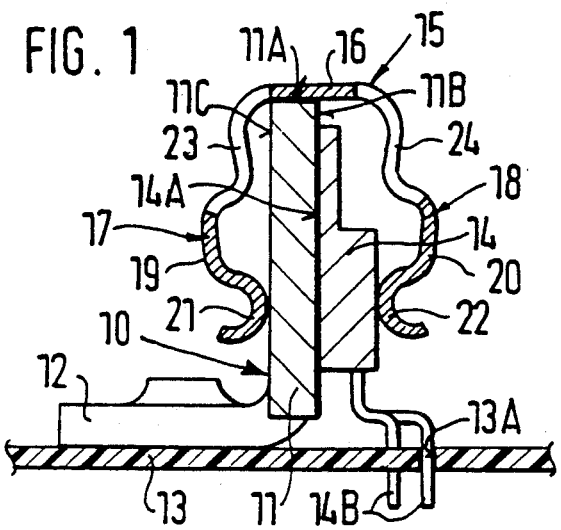
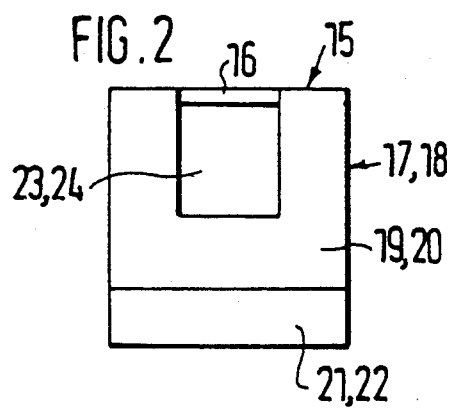
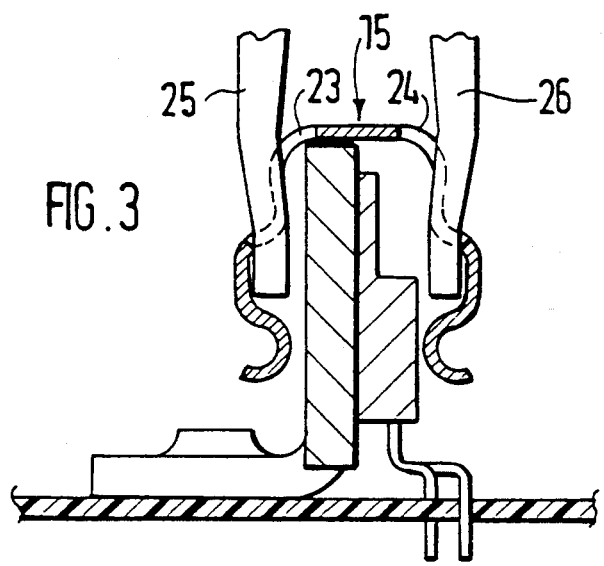
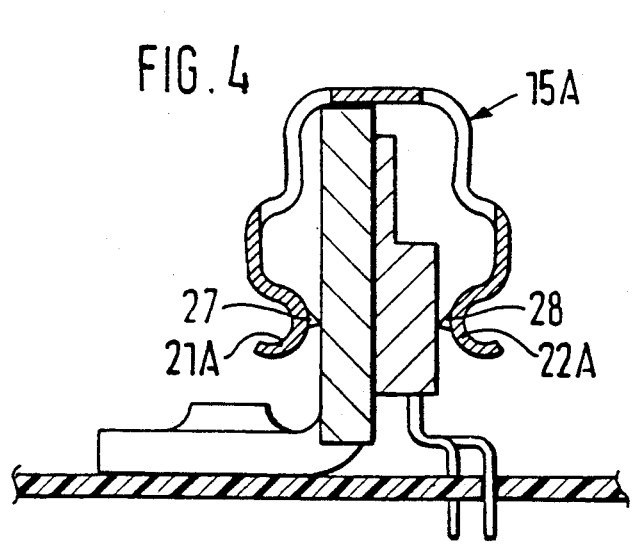
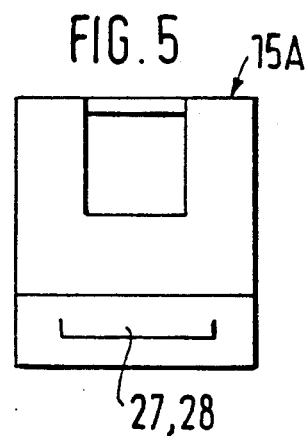

SPRING ELEMENT FOR A GROUP OF COMPONENTS OF AN ELECTRONIC CONTROL DEVICE

FIELD OF THE INVENTION

The present invention relates generally to spring elements for securing waste-heat-generating electronic components onto a heat sink or cooling fin and, more particularly, to an improved spring element which can be automatically mounted without exerting any harmful shear forces.

BACKGROUND

It is known to slide a spring element over a waste-heat-generating component and its heat sink to press the two together to assure reliable heat transfer between them. This sliding motion exerts shear forces on the components, which may damage or displace them, sometimes causing their terminal wires to snap off. It is also known to rivet or screw the electrical components on the cooling element. This has the disadvantage that a lot of material is required, a lot of labor is used in the fastening process, and the height of the overall structure increases, leading to a larger overall control device.

THE INVENTION

Accordingly, it is a primary object of the present invention to provide a spring element which can be mounted without causing shear stresses or unduly enlarging the structure.

Briefly, this is accomplished by forming a spring clip with slots through which automatic tongs can spread the clip, releasing it to grip the component and cooling fin only when the clip is in final position. Thus, no shear stresses occur.

The spring element is symmetrically constructed, simple and inexpensive to make, and can be automatically mounted. The resulting structure can be kept compact, since no cooling fin surfaces extending far beyond the component edges are needed for fastening of the spring element.

DRAWINGS

Two preferred embodiments of the invention are described below, with reference to the accompanying drawings, in which:

FIG. 1 is a sectional view of a group of components and a first embodiment of the spring element of the invention;

FIG. 2 is a side view of a spring element;

FIG. 3 is a further cross-sectional view, including tongs of an automatic mounting apparatus, shown broken away;

FIGS. 4 and 5 illustrate a second embodiment of the invention, FIG. 4 being a sectional view through a group of components, and FIG. 5 being a side view of the spring element.

DETAILED DESCRIPTION

In FIG. 1, a cooling element 10 is arranged in an electronic control device, which may be of any conventional structure and therefore is not further detailed. Element 10 includes a cooling fin or heat sink 11 and at least one laterally extending securing support bar or flange 12. These securing bar(s) serve, first, to secure the cooling element to a printed circuit board 13 having conductive tracks, and, second, to connect the cooling element to a heat-conductive housing (not shown) and/or to a portion of a motor vehicle.

One major surface of cooling fin 11, the right surface 11B shown in FIG. 1, rests in planar contact with a back surface 14A of a power component 14 to be cooled. Fin 11 preferably, but not necessarily, projects essentially normal to PC board 13. PC board 13 is made with a plurality of holes 13A through which terminal wires 14B of component 14 are fed, for example for soldering to tracks on the underside of PC board 13.

In order to fix power component 14 in position and assure good heat transfer contact with fin 11, these two are pressed together with a spring element 15. This spring element is essentially U-shaped and preferably made of springy sheet metal. The back or bridge portion 16 of element 15 rests on upper end face 11A of fin 11; one spring leg 17 rests on free (left) side face 11C of fin 11, while the other spring leg 18 rests on the fin-remote face of power component 14. Each of spring legs 17, 18 includes an intermediate respective convexly extending bend or meander 19, 20. The lower end of each meander angles inward and transitions into an oppositely (that is, concavely) curved terminal end 21, 22. As previously noted, the inner surfaces of these terminal ends rest respectively against the cooling fin and against the power component. The intermediate bends extend laterally wider than the bridge portion and terminal ends of the legs.

As shown in FIG. 2, above the meanders, the spring legs are each formed with a respective opening or slot 23, 24, which extends up to bridge or back 16 of the spring element.

In order to automatically mount the thus-described spring element, it is handled by an automatic mounting device, as shown in FIG. 3. Two tong elements 25, 26 engage from above, through slots 23, 24, and spread open the spring element. The spring element is then positioned around the pre-mounted cooling fin-power element combination, the tongs move toward one another until the spring legs ends 21, 22 press against the combination, and the tongs ar then retracted upward.

The aforementioned assembly process exerts no shearing forces on the power component, so that damage and shifting are minimized. The symmetrical form of the spring legs of the spring element facilitates its engagement and positioning, using the automatic mounting device.

One could also broaden the back or bridge portion 16 of the spring element, in order to accommodate a further power component (not shown), which would be placed on the other (left) side of fin 11, and thereby pressed together with first one (14) and fixed.

Furthermore, the spring element of the present invention can be used whenever fixing or guiding elements are used to improve an automatic mounting process for power components.

FIGS. 4 and 5 illustrate a second embodiment 15A of the spring element structure which is distinguished, by a different terminal end shape, from the structure previously described.

The inner surfaces, i.e. those closest to the axis of symmetry, of the concave terminal ends 21A, 22A are each formed with a respective tooth or claw 27, 28, for example formed by making a U-shaped slit in the metal, as shown in FIG. 5, and bending a metal tab out of the plane of the rest of the metal spring element. These teeth improve the hold of spring element 15A, particularly making the structure more vibration-resistant.

In order to still further improve vibration resistance, in the embodiment with only a single power component, one could provide a groove in the cooling fin, into which the tooth or claw 27 would engage, in the mounted state.

We claim:

1. A spring element in an electronic control device including a cooling element (10, 11);

at least one waste-heat-generating electrical component (14) mounted on said cooling element; and an essentially U-shaped spring element (15, 15A) having a bridge portion (16) and a pair of spring legs (17, 18) which each press one of said cooling element and said power component toward the other, wherein, said spring element (15, 15A) has an opening, extending from said bridge portion (16), in each spring leg, and each leg has a curved intermediate segment (19, 20) which extends laterally wider than said bridge portion and than terminal ends of said legs, thereby facilitating engagement of a mounting tool (25, 26) for spreading open said spring element without harming said electrical component (14).

2. A spring element according to claim 1, wherein a free terminal end (21, 22) of each spring leg (17, 18) presents a concave outer surface.

3. A spring element according to claim 1, wherein said spring legs (17, 18) are symmetrical with each other.

4. A spring element according to claim 2, wherein said spring legs (17, 18) are symmetrical with each other.

5. A spring element in an electronic control device including a cooling element (10, 11);

at least one waste-heat-generating electrical component (14) mounted on said cooling element; and an essentially U-shaped spring element (15, 15A) having a bridge portion (16) and a pair of spring legs (17, 18) which each press one of said cooling element and said power component toward the other, wherein, said spring element spring legs each have an opening, extending from said bridge portion (16), and each leg has a terminal end (21A, 22A) with a claw (27, 28) directed inward toward said cooling element, thereby providing resistance to vibration.

* * * * *